United States Patent
Sunohara et al.

(10) Patent No.: US 12,400,897 B2
(45) Date of Patent: *Aug. 26, 2025

(54) SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Riku Nishikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 201 days.

This patent is subject to a terminal disclaimer.

(21) Appl. No.: 18/334,662

(22) Filed: Jun. 14, 2023

(65) Prior Publication Data

US 2023/0411199 A1    Dec. 21, 2023

(30) Foreign Application Priority Data

Jun. 16, 2022    (JP) ................. 2022-097236

(51) Int. Cl.
*H01L 21/683* (2006.01)
*H01L 21/687* (2006.01)

(52) U.S. Cl.
CPC .... *H01L 21/6833* (2013.01); *H01L 21/68757* (2013.01)

(58) Field of Classification Search
CPC .............. H01L 21/6833; H01L 21/68757
See application file for complete search history.

(56) References Cited

U.S. PATENT DOCUMENTS

| 2018/0047604 A1* | 2/2018 | Takemoto | H01L 21/6831 |
| 2018/0151402 A1* | 5/2018 | Noorbakhsh | H01L 21/68785 |
| 2018/0374735 A1* | 12/2018 | Fujita | H02N 13/00 |

FOREIGN PATENT DOCUMENTS

JP    2021-111688 A    8/2021

* cited by examiner

*Primary Examiner* — George R Koch
(74) *Attorney, Agent, or Firm* — Rankin, Hill & Clark LLP

(57) ABSTRACT

A substrate fixing device includes a base plate, a ceramic plate fixed to the base plate and configured to adsorb a substrate by electrostatic force, and an adhesive layer bonding the base plate and the ceramic plate. The adhesive layer includes a plurality of linear heat transfer bodies arranged adjacent to each other such that a longitudinal direction of each linear heat transfer body is along a stack direction of the ceramic plate and the base plate, and a resin filled between adjacent heat transfer bodies of the heat transfer bodies and bonded to the ceramic plate and the base plate.

5 Claims, 17 Drawing Sheets

SUBSTRATE FIXING DEVICE

CROSS-REFERENCE TO RELATED APPLICATIONS

This application is based on and claims the benefit of priority from prior Japanese patent application No. 2022-097236 filed on Jun. 16, 2022, the entire contents of which are incorporated herein by reference.

TECHNICAL FIELD

The present invention relates to a substrate fixing device.

BACKGROUND ART

In general, a substrate fixing device that adsorbs and holds a wafer when manufacturing a semiconductor component, for example, is also referred to as an electrostatic chuck (ESC), and includes a ceramic plate having an electrode embedded therein. The substrate fixing device has a structure in which the ceramic plate is bonded to a base plate, and applies a voltage to the electrode embedded in the ceramic plate, thereby adsorbing the wafer on the ceramic plate by using electrostatic force. By adsorbing and holding the wafer on the ceramic plate, processes such as microfabrication and etching on the wafer are efficiently performed.

In such a substrate fixing device, the ceramic plate is bonded to the base plate by, for example, a silicone resin-based adhesive. When the ceramic plate and the base plate are bonded by an adhesive, since the thermal resistance of the adhesive in a thickness direction is relatively large, the transfer of heat from the ceramic plate adsorbing the wafer to the base plate is inhibited, which may make it difficult to rapidly control a temperature of the wafer. Regarding this, in order to improve the heat transfer property from the ceramic plate to the base plate, a technology of bonding the ceramic plate to the base plate by an adhesive layer composed of a carbon nanotube assembly having high thermal conductivity in a longitudinal direction, instead of the adhesive, is suggested.

CITATION LIST

Patent Literature

PTL 1: JP2021-111688A

SUMMARY OF INVENTION

However, when the adhesive layer composed of the carbon nanotube assembly is used, the thermal responsiveness in the adhesive layer is improved, but there is a problem in that the adhesiveness may decrease. Specifically, when the ceramic plate and the base plate are bonded based only on the intermolecular force of the carbon nanotubes in the adhesive layer, the bonding strength of the ceramic plate and the base plate is relatively low. For this reason, the adhesive layer may peel off from the ceramic plate or the base plate due to the stress caused by a difference in thermal expansion coefficient between the ceramic plate and the base plate.

Aspect of non-limiting embodiments of the present disclosure is to provide a substrate fixing device capable of improving thermal responsiveness and adhesiveness in an adhesive layer.

According to an aspect of the present disclosure, there is provided a substrate fixing device including a base plate, a ceramic plate, and an adhesive layer. The ceramic plate is fixed to the base plate and is configured to adsorb a substrate by electrostatic force. The adhesive layer is configured to bond the base plate and the ceramic plate. The adhesive layer has a plurality of linear heat transfer bodies and a resin. The plurality of heat transfer bodies are arranged adjacent to each other so that a longitudinal direction of each linear heat transfer body is along a stack direction of the ceramic plate and the base plate. The resin is filled between adjacent heat transfer bodies of the heat transfer bodies and is bonded to the ceramic plate and the base plate.

According to one aspect of the substrate fixing device, it is possible to achieve the effect of improving thermal responsiveness and adhesiveness in the adhesive layer.

DESCRIPTION OF EMBODIMENTS

Hereinafter, embodiments of a substrate fixing device and a manufacturing method of a substrate fixing device disclosed by the present disclosure will be described in detail with reference to the drawings. Note that the disclosed technology is not limited to the embodiments.

First Embodiment

Figure 1:
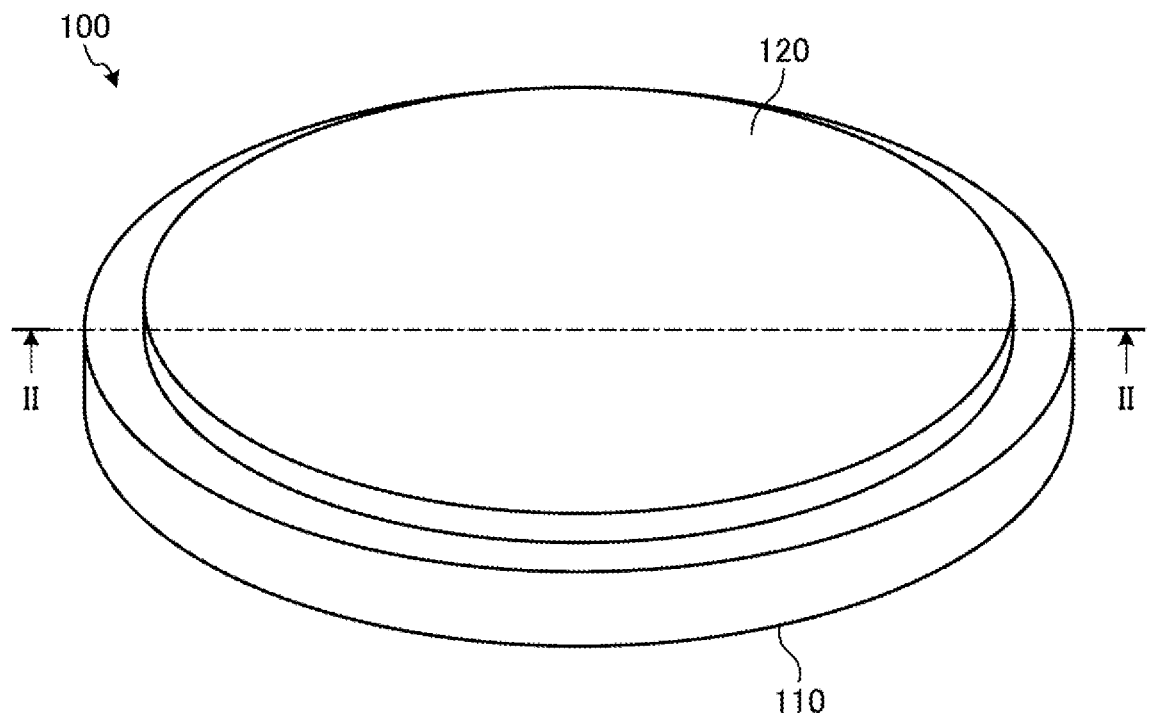
FIG. 1 is a perspective view showing a configuration of a substrate fixing device according to a first embodiment.

FIG. 1 is a perspective view showing a configuration of a substrate fixing device 100 according to a first embodiment. The substrate fixing device 100 shown in FIG. 1 has a structure in which a ceramic plate 120 is bonded to a base plate 110.

The base plate 110 is a circular member made of metal such as aluminum, for example. The base plate 110 is a base member for fixing the ceramic plate 120. The base plate 110 is attached to a semiconductor manufacturing apparatus, for example, and causes the substrate fixing device 100 to function as a semiconductor holding device for holding a wafer.

The ceramic plate 120 is a circular member made of insulating ceramic. A diameter of the ceramic plate 120 is smaller than a diameter of the base plate 110, and the ceramic plate 120 is fixed to a center of the base plate 110. That is, a lower surface of the ceramic plate 120 serves as an adhesive surface that is bonded to the base plate 110, and the adhesive surface is bonded to the base plate 110, so that the ceramic plate 120 is fixed. An upper surface of the ceramic plate 120 is, for example, an adsorption surface for adsorbing a target object to be adsorbed, such as a wafer.

The ceramic plate 120 has an electrically conductive electrode embedded therein, and adsorbs a target object such as a wafer to the adsorption surface by using electrostatic force that is generated when a voltage is applied to the electrode. In addition, the ceramic plate 120 has a heater electrode embedded therein, and adjusts temperatures of the ceramic plate 120 and the target object such as a wafer adsorbed on the ceramic plate 120 by the heater electrode that generates heat when a voltage is applied thereto.

Figure 2:
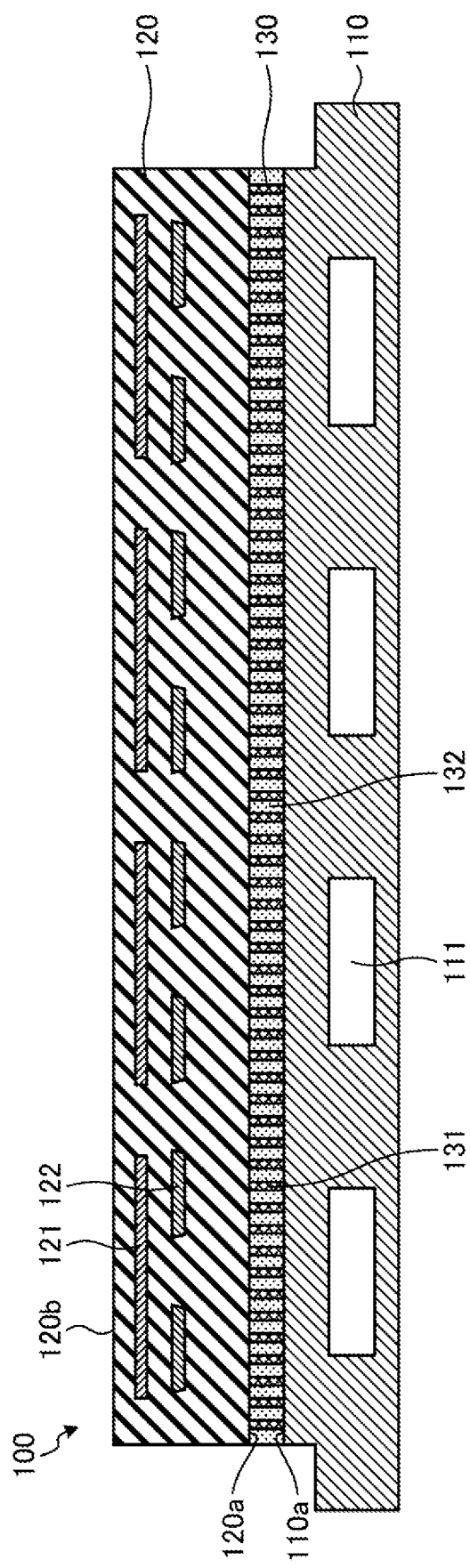
FIG. 2 is a schematic view showing a cross section of the substrate fixing device according to the first embodiment.

FIG. 2 is a schematic view showing a cross section of the substrate fixing device 100 according to the first embodiment. In FIG. 2, a cross section taken along a line II-II in FIG. 1 is shown. As shown in FIG. 2, the substrate fixing device 100 is configured by bonding the base plate 110 and the ceramic plate 120 with an adhesive layer 130.

The base plate 110 is a circular member made of metal and having a thickness of about 20 to 50 mm, for example. In the base plate 110, a refrigerant passage 111 serving as a passage for refrigerant such as cooling water or cooling gas is formed. The refrigerant passes through the refrigerant passage 111, so that the ceramic plate 120 is cooled. The ceramic plate 120 is cooled, so that the target object such as a wafer adsorbed on the adsorption surface of the ceramic plate 120 is cooled. An upper surface 110a of the base plate 110 is an adhesive surface that is bonded to the ceramic plate 120, and is bonded to a lower surface 120a of the ceramic plate 120 by the adhesive layer 130.

The ceramic plate 120 is a circular plate made of ceramic and having a thickness of 4 to 6 mm, for example. The ceramic plate 120 can be obtained by firing a green sheet fabricated using aluminum oxide, for example. The lower surface 120a of the ceramic plate 120 is an adhesive surface that is bonded to the base plate 110, and is bonded to the upper surface 110a of the base plate 110 by the adhesive layer 130. In the ceramic plate 120, an electrode 121 and a heater electrode 122 are formed.

The electrode 121 is arranged in the ceramic plate 120, and generates electrostatic force when a voltage is applied thereto. By the electrostatic force, the ceramic plate 120 adsorbs a target object such as a wafer to an upper surface 120b serving as an adsorption surface.

The heater electrode 122 is arranged below the electrode 121 in the ceramic plate 120, and generates heat when a voltage is applied thereto. Due to heat generated by the heater electrode 122, the ceramic plate 120 heats the ceramic plate 120 and the target object such as a wafer adsorbed on the upper surface 120b of the ceramic plate 120.

The adhesive layer 130 bonds the base plate 110 and the ceramic plate 120. The adhesive layer 130 has a property (hereinafter, appropriately referred to as 'thermal anisotropy') that thermal conductivity in a stack direction in which the base plate 110 and the ceramic plate 120 are stacked (which may also be simply referred to as 'stack direction', hereinafter) is higher than thermal conductivity in a plane direction perpendicular to the stack direction. Specifically, the adhesive layer 130 has a structure in which a plurality of carbon nanotubes 131, each having thermal conductivity in a longitudinal direction higher than thermal conductivity in other directions, are embedded in a resin 132.

The plurality of carbon nanotubes 131 are linear crystals made of carbon, and are arranged adjacent to each other so that the longitudinal direction faces toward the stack direction of the base plate 110 and the ceramic plate 120. In other words, the plurality of carbon nanotubes 131 are arranged adjacent to each other so that the longitudinal direction of each carbon nanotube 131 is along the stack direction of the base plate 110 and the ceramic plate 120. The thermal conductivity of the carbon nanotubes 131 in the longitudinal direction is higher than that of the ceramic plate 120. The carbon nanotube 131 is an example of the heat transfer body.

The resin 132 is filled between the adjacent carbon nanotubes 131 and is bonded to the ceramic plate 120 and the base plate 110. As the resin 132, for example, a thermosetting resin, a thermoplastic resin, or the like can be used. As the thermosetting resin, for example, an epoxy-based resin, a polyimide-based resin, a phenol-based resin, a silicone-based resin or the like can be used. As the thermoplastic resin, for example, a polyethylene-based resin, a polyphenylene-based resin, a polyether-based resin, an acrylic resin, a fluorine-based resin or the like can be used.

By bonding the base plate 110 and the ceramic plate 120 with the adhesive layer 130 having a structure in which the plurality of carbon nanotubes 131 are embedded in the resin 132, the heat can be smoothly transferred through the adhesive layer 130, as compared with a case in which an adhesive is used. For this reason, the heat transfer property from the ceramic plate 120 to the base plate 110 via the adhesive layer 130 is improved, and therefore, the thermal responsiveness in the adhesive layer 130 can be improved. In addition, since the resin 132 is bonded to the ceramic plate 120 and the base plate 110, the bonding strength of the ceramic plate 120 and the base plate 110 is increased, as compared with a case in which an adhesive layer composed of the carbon nanotube assembly is used. Thereby, even when the stress due to a difference in thermal expansion coefficient between the ceramic plate 120 and the base plate 110 acts on the adhesive layer 130, the peeling off of the adhesive layer 130 can be suppressed and the adhesiveness in the adhesive layer 130 can be improved.

In addition, the resin 132 covers the carbon nanotubes 131 in a state in which upper and lower end surfaces of the carbon nanotubes 131 in the longitudinal direction are exposed. Thereby, since the upper end surfaces of the carbon nanotubes 131 in the longitudinal direction can be brought into contact with the ceramic plate 120 and the lower end surfaces of the carbon nanotubes 131 in the longitudinal direction can be brought into contact with the base plate 110, the heat can be further smoothly transferred via the adhesive layer 130.

Figure 3:
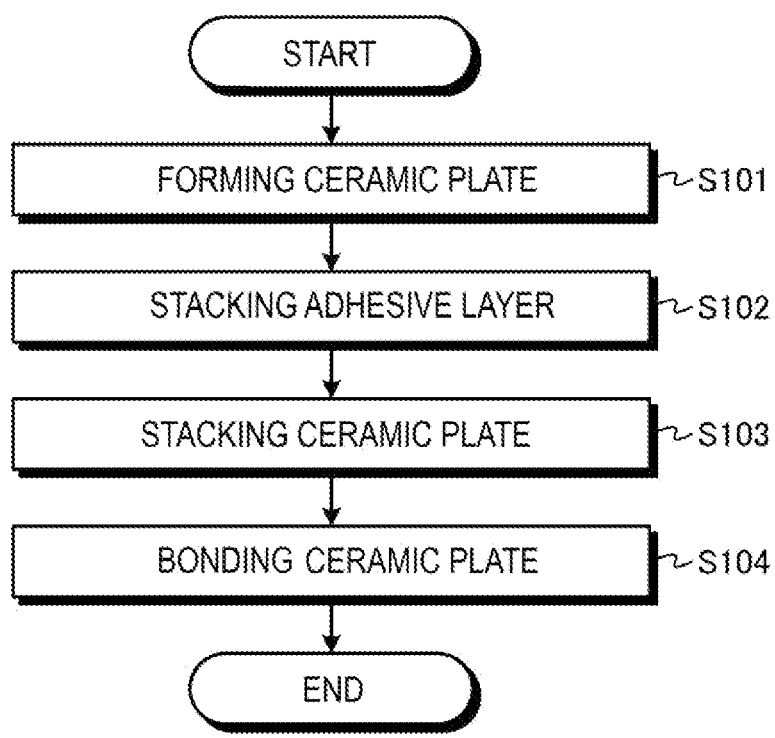
FIG. 3 is a flowchart of showing a manufacturing method of the substrate fixing device according to the first embodiment.

Next, a manufacturing method of the substrate fixing device 100 configured as described above will be described with reference to FIG. 3. FIG. 3 is a flowchart showing a manufacturing method of the substrate fixing device 100 according to the first embodiment.

Figure 4:
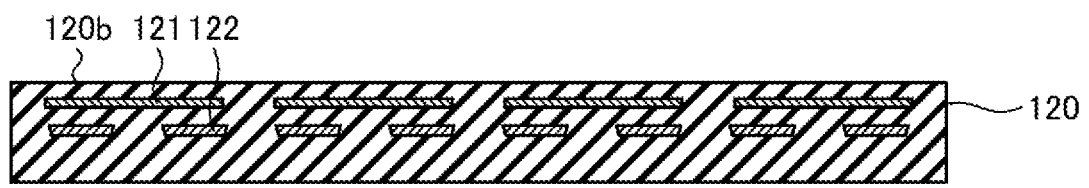
FIG. 4 shows a specific example of a ceramic plate.

First, a ceramic plate 120 for adsorbing a target object such as a wafer is formed (step S101). Specifically, a plurality of green sheets made of, for example, aluminum oxide as a main material are fabricated. An electrode 121 is appropriately formed on one surface of the green sheet, and a heater electrode 122 is formed on one surface of another green sheet. The electrode 121 and the heater electrode 122 may be each formed by screen printing a metal paste on the surface of the green sheet, for example. Then, a ceramic plate 120 is formed by stacking and firing the plurality of green sheets. The ceramic plate 120 has a layer of the electrode 121 and a layer of the heater electrode 122 embedded therein, as shown in FIG. 4, for example. FIG. 4 shows a specific example of the ceramic plate 120. Note that, if necessary, the heater electrode 122 may be omitted.

Figure 5:
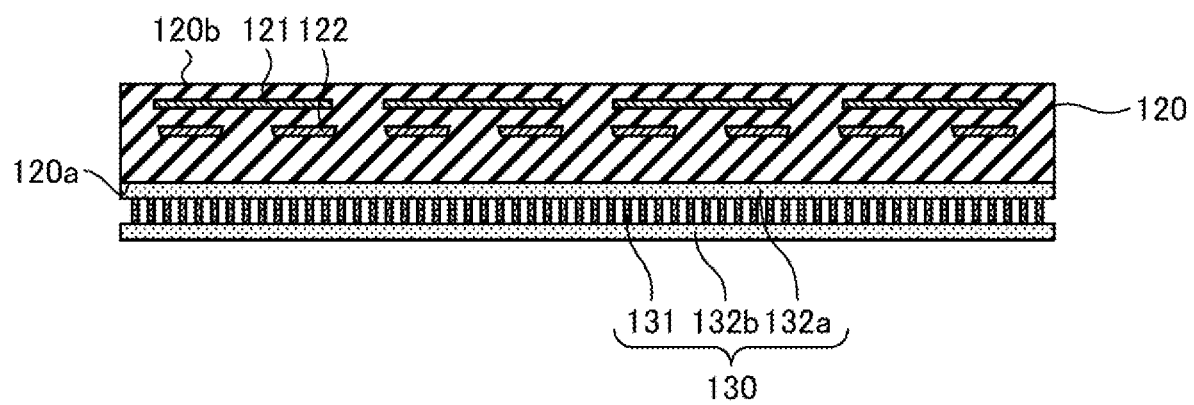
FIG. 5 shows a specific example of an adhesive layer stacking process.

When the ceramic plate 120 is formed, an adhesive layer is stacked on the ceramic plate 120 (step S102). Specifically, for example, as shown in FIG. 5, an adhesive layer 130 composed of a plurality of carbon nanotubes 131 and resin sheets 132a and 132b is temporarily bonded to a lower surface 120a of the ceramic plate 120 from the resin sheet 132a side. FIG. 5 shows a specific example of an adhesive layer stacking process. The resin sheets 132a and 132b are sheet-like members formed using a semi-cured resin for forming the resin 132, and support a plurality of carbon nanotubes 131 interposed therebetween. The resin sheet 132a is connected to upper end portions of the carbon nanotubes 131, and the resin sheet 132b is connected to lower end portions of the carbon nanotubes 131. In the step in which the adhesive layer 130 is stacked on the ceramic plate 120, the resin 132 is not yet filled between the adjacent carbon nanotubes 131 in the adhesive layer 130.

Figure 6:
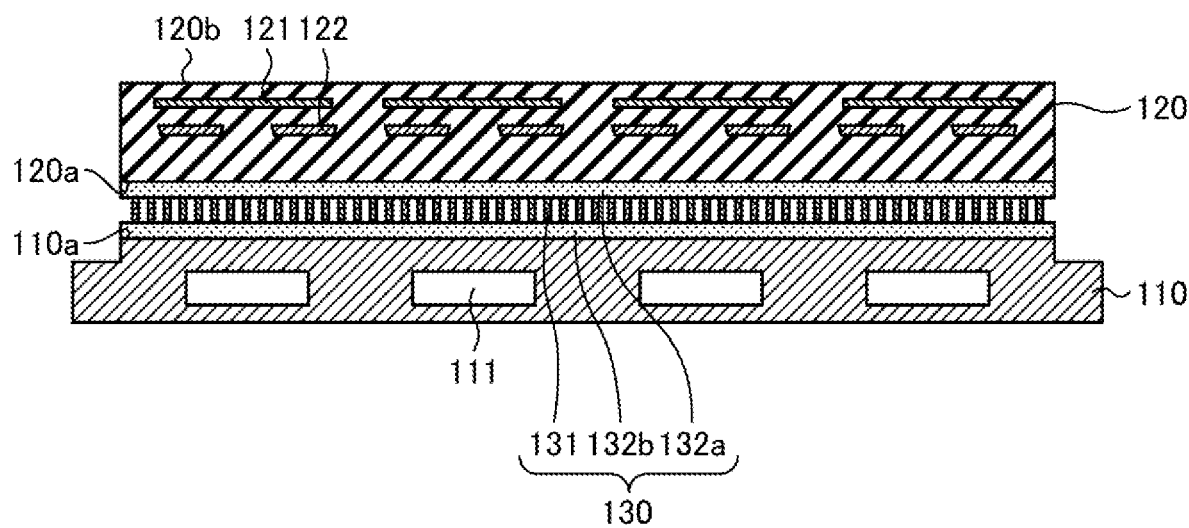
FIG. 6 shows a specific example of a ceramic plate stacking process.

Then, the ceramic plate 120 having the adhesive layer 130 stacked thereon is stacked on the base plate 110 via the adhesive layer 130 (step S105). Specifically, for example, as shown in FIG. 6, the ceramic plate 120 having the adhesive layer 130 stacked thereon is temporarily bonded to the upper surface 110a of the base plate 110 from the resin sheet 132b side of the adhesive layer 130. FIG. 6 shows a specific example of a ceramic plate stacking process.

Then, the ceramic plate 120 stacked on the base plate 110 via the adhesive layer 130 is bonded to the base plate 110 (step S104). Specifically, the semi-cured resin forming the resin sheets 132a and 132b is filled between the adjacent carbon nanotubes 131 in the adhesive layer 130 by heating and pressurization, and the filled resin is cured with being in contact with the ceramic plate 120 and the base plate 110. Thereby, the resin 132 filled between the adjacent carbon nanotubes 131 and bonded to the ceramic plate 120 and the base plate 110 is formed. As a result, the base plate 110 and the ceramic plate 120 are bonded by the adhesive layer 130, so that a substrate fixing device 100 is completed.

In the substrate fixing device 100, since the base plate 110 and the ceramic plate 120 are bonded by the adhesive layer 130 having a structure in which the plurality of carbon nanotubes 131 are embedded in the resin 132, the thermal responsiveness and adhesiveness in the adhesive layer 130 can be improved.

As described above, a substrate fixing device (e.g., substrate fixing device 100) according to the first embodiment includes a base plate (e.g., base plate 110), a ceramic plate (e.g., ceramic plate 120), and an adhesive layer (e.g., adhesive layer 130). The ceramic plate is fixed to the base plate and adsorbs a substrate (e.g., wafer) by electrostatic force. The adhesive layer bonds the base plate and the ceramic plate. The adhesive layer includes a plurality of linear heat transfer bodies (e.g., carbon nanotubes 131) and a resin (e.g., resin 132). The plurality of heat transfer bodies are arranged adjacent to each other so that a longitudinal direction faces towards the stack direction of the ceramic plate and the base plate. In other words, the plurality of heat transfer bodies are arranged adjacent to each other so that the longitudinal direction of each heat transfer body is along the stack direction of the ceramic plate and the base plate. The resin is filled between the adjacent heat transfer bodies and is bonded to the ceramic plate and the base plate. Thereby, according to the substrate fixing device of the first embodiment, the thermal responsiveness and adhesiveness in the adhesive layer can be improved.

In addition, the ceramic plate may has an electrode (e.g., heater electrode 122) embedded therein for generating heat. Thereby, according to the substrate fixing device of the first embodiment, it is possible to adjust a temperature of the ceramic plate and a temperature of the substrate adsorbed on the ceramic plate to desired temperatures.

Second Embodiment

A second embodiment is different from the first embodiment in that the ceramic plate and the base plate are bonded using an adhesive in addition to the adhesive layer.

Figure 7:
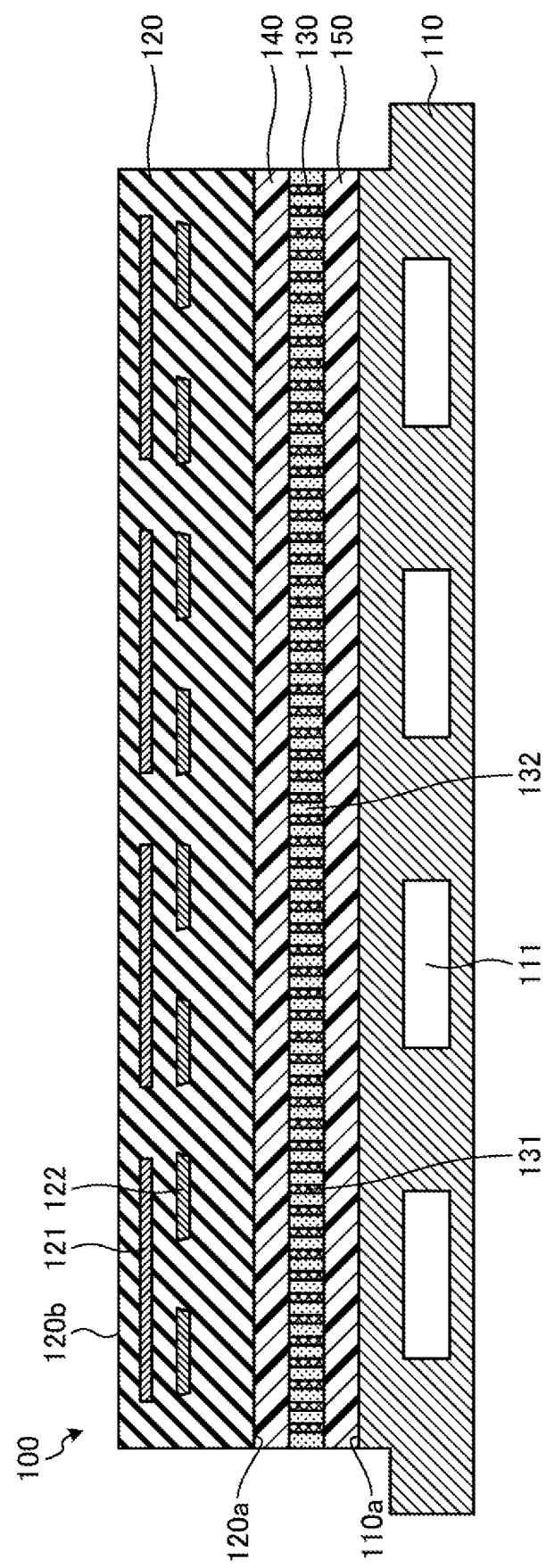
FIG. 7 is a schematic view showing a cross section of a substrate fixing device according to a second embodiment.

FIG. 7 is a schematic view showing a cross section of the substrate fixing device 100 according to the second embodiment. In FIG. 7, the same parts as those in FIG. 2 are denoted with the same reference signs. The substrate fixing device 100 shown in FIG. 7 includes a first adhesive 140 and a second adhesive 150, in addition to each part shown in FIG. 2.

The first adhesive 140 is arranged between the ceramic plate 120 and the adhesive layer 130. The second adhesive 150 is arranged between the base plate 110 and the adhesive layer 130. The first adhesive 140 and the second adhesive 150 may be formed of, for example, the same resin as the resin 132 of the adhesive layer 130 or a resin different from the resin 132. As the resin forming the first adhesive 140 and the second adhesive 150, for example, a thermosetting resin, a thermoplastic resin or the like can be used. As the thermosetting resin, for example, an epoxy-based resin, a polyimide-based resin, a phenol-based resin, a silicone-based resin or the like can be used. As the thermoplastic resin, for example, a polyethylene-based resin, a polyphenylene-based resin, a polyether-based resin, an acrylic resin, a fluorine-based resin or the like can be used.

The adhesive layer 130 is bonded to the ceramic plate 120 via the first adhesive 140 and is bonded to the base plate 110 via the second adhesive 150. In other words, the ceramic plate 120 is bonded to the base plate 110 by the adhesive layer 130, the first adhesive 140 and the second adhesive 150. With such a configuration, the bonding strength of the ceramic plate 120 and the base plate 110 is increased, as compared with the case in which the ceramic plate 120 is bonded to the base plate 110 only by the adhesive layer 130.

Figure 8:
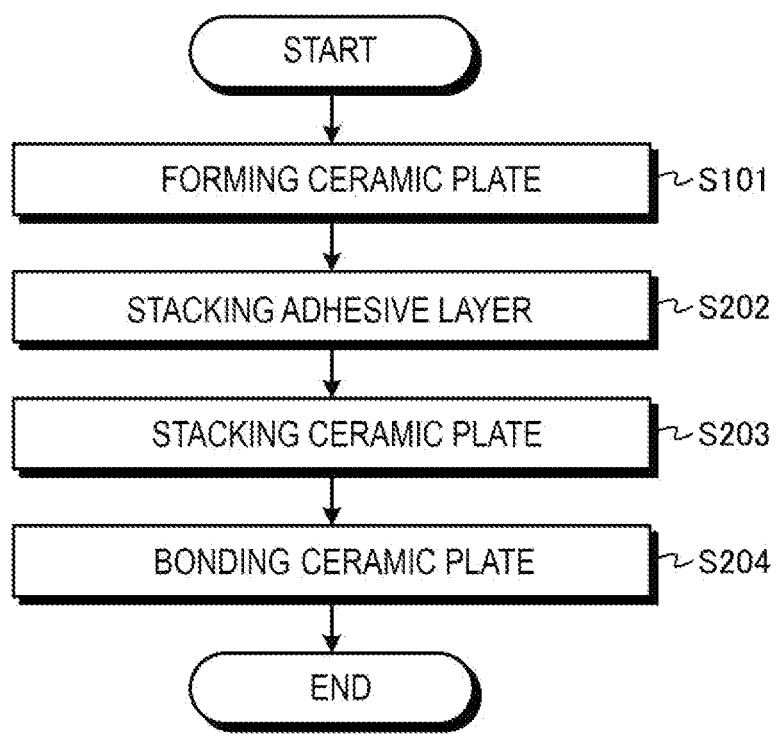
FIG. 8 is a flowchart showing a manufacturing method of the substrate fixing device according to the second embodiment.

Next, a manufacturing method of the substrate fixing device 100 configured as described above will be described with reference to FIG. 8. FIG. 8 is a flowchart showing a manufacturing method of the substrate fixing device 100 according to the second embodiment. Note that, in FIG. 8, the same parts as those in FIG. 3 are denoted with the same reference signs.

Figure 9:
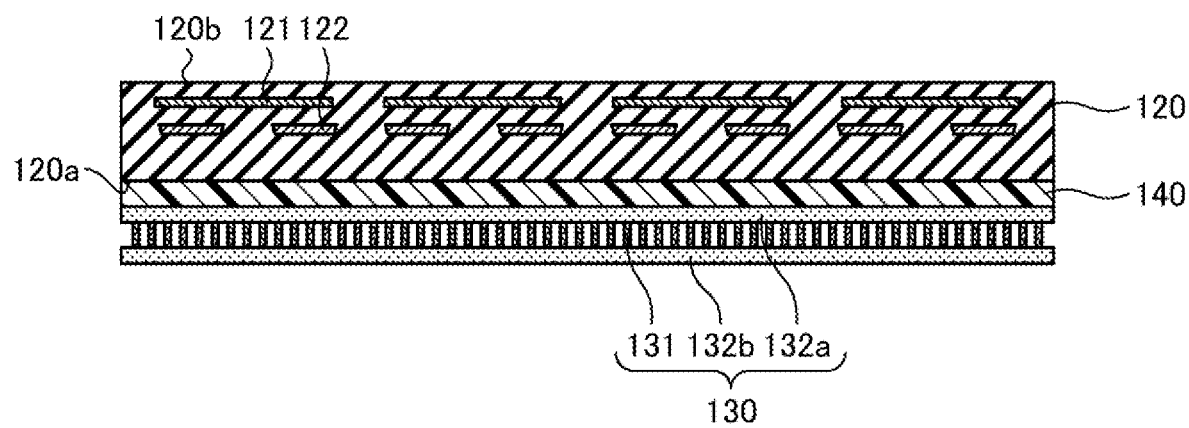
FIG. 9 shows a specific example of an adhesive layer stacking process.

When the ceramic plate 120 is formed in step S101, an adhesive layer is stacked on the ceramic plate 120 (step S202). Specifically, for example, as shown in FIG. 9, the adhesive layer 130 composed of the plurality of carbon nanotubes 131 and the resin sheets 132*a* and 132*b* is temporarily bonded to the lower surface 120*a* of the ceramic plate 120 from the resin sheet 132*a* side via the first adhesive 140. FIG. 9 shows a specific example of an adhesive layer stacking process. In the step in which the adhesive layer 130 is stacked on the ceramic plate 120, the resin 132 is not yet filled between the adjacent carbon nanotubes 131 in the adhesive layer 130.

Figure 10:
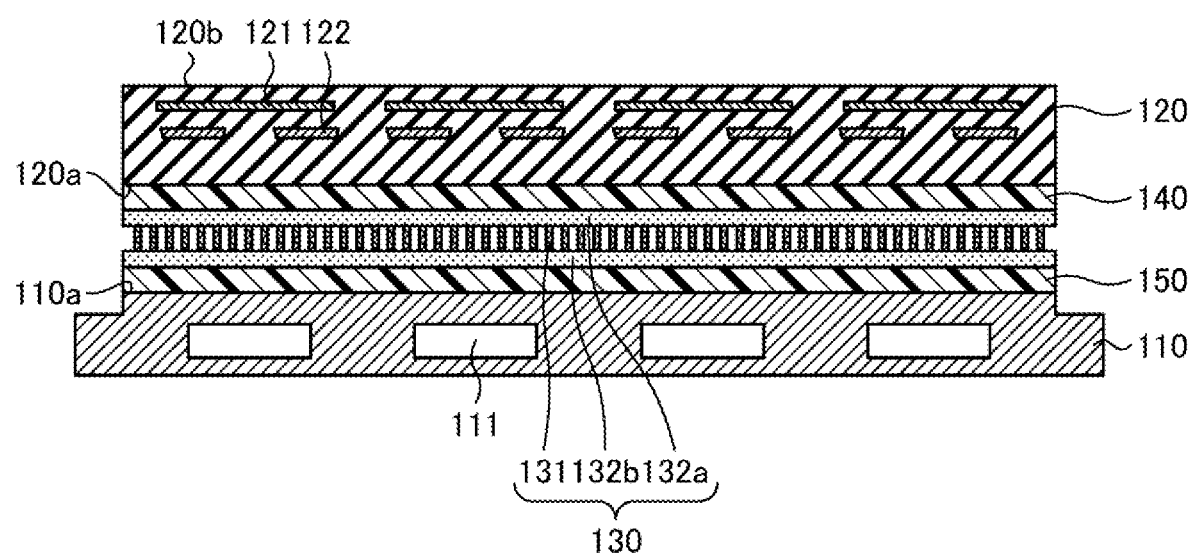
FIG. 10 shows a specific example of a ceramic plate stacking process.

Then, the ceramic plate 120 having the adhesive layer 130 stacked thereon is stacked on the base plate 110 via the first adhesive 140, the adhesive layer 130, and the second adhesive 150 (step S203). Specifically, for example, as shown in FIG. 10, the ceramic plate 120 having the adhesive layer 130 stacked thereon is temporarily bonded to the upper surface 110*a* of the base plate 110 from the resin sheet 132*b* side of the adhesive layer 130 via the second adhesive 150. FIG. 10 shows a specific example of a ceramic plate stacking process.

Then, the ceramic plate 120 stacked on the base plate 110 via the first adhesive 140, the adhesive layer 130, and the second adhesive 150 is bonded to the base plate 110 (step S204). Specifically, the semi-cured resin forming the resin sheets 132*a* and 132*b* is filled between the adjacent carbon nanotubes 131 in the adhesive layer 130 by heating and pressurization, and the filled resin is cured with being in contact with the first adhesive 140 and the second adhesive 150. Thereby, the resin 132 filled between the adjacent carbon nanotubes 131 is bonded to the ceramic plate 120 via the first adhesive 140 and is bonded to the base plate 110 via the second adhesive 150. As a result, the base plate 110 and the ceramic plate 120 are bonded by the first adhesive 140, the adhesive layer 130, and the second adhesive 150, so that the substrate fixing device 100 is completed.

As described above, the substrate fixing device according to the second embodiment further includes a first adhesive (e.g., first adhesive 140) and a second adhesive (e.g., second adhesive 150). The first adhesive is arranged between the ceramic plate and the adhesive layer. The second adhesive is arranged between the base plate and the adhesive layer. The adhesive layer is bonded to the ceramic plate via the first adhesive, and is bonded to the base plate via the second adhesive. Thereby, according to the substrate fixing device of the second embodiment, the bonding strength of the ceramic plate and the base plate is increased, as compared with the case in which the ceramic plate is bonded to the base plate only by the adhesive layer.

Note that, in the present embodiment, the ceramic plate 120 has the heater electrode 122 embedded therein. However, the arrangement of the heater electrode is not limited thereto and can be variously changed. Below, modified embodiments of the substrate fixing device 100 will be specifically described.

Figure 11:
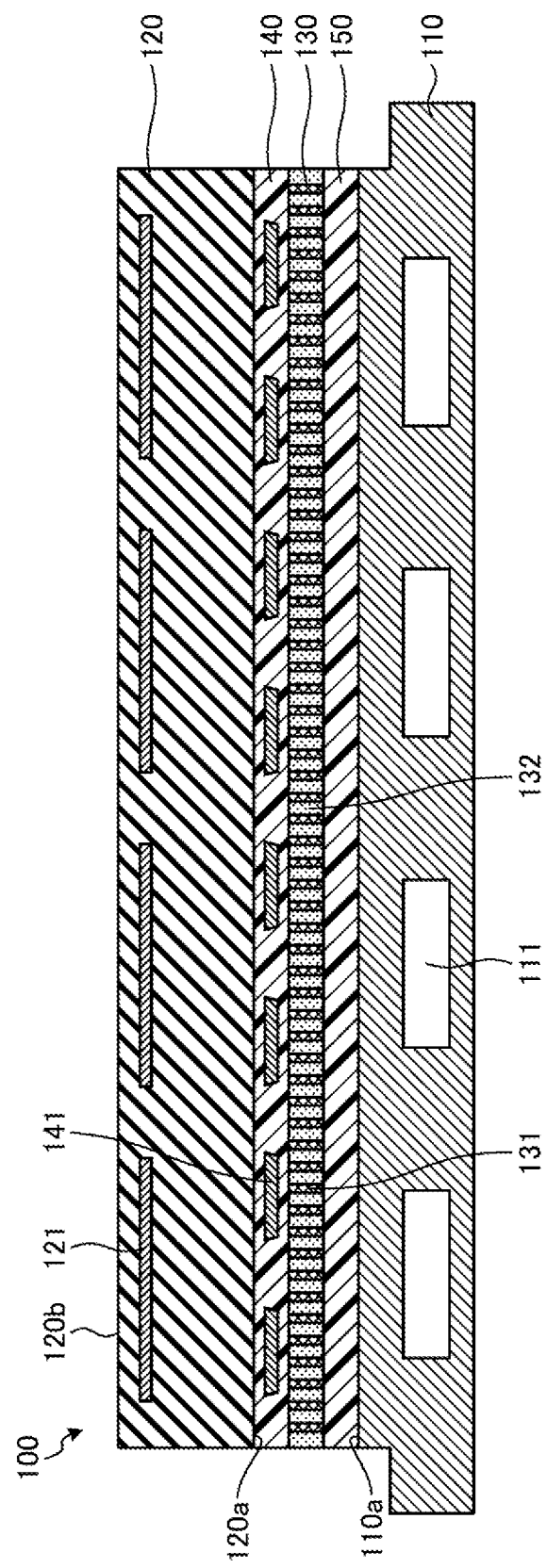
FIG. 11 shows a first modified embodiment of the substrate fixing device according to the second embodiment.

FIG. 11 shows a first modified embodiment of the substrate fixing device 100 according to the second embodiment. In FIG. 11, the same parts as those in FIG. 7 are denoted with the same reference signs.

In the modified embodiment shown in FIG. 11, a heater electrode 141 is arranged in the first adhesive 140. The heater electrode 141 generates heat when a voltage is applied thereto. Due to the heat generated by the heater electrode 141, the first adhesive 120 heats the ceramic plate 120 and a target object such as a wafer adsorbed on the upper surface 120*b* of the ceramic plate 120. In this way, the temperature of the ceramic plate 120 and the temperature of the target object such as a wafer adsorbed on the ceramic plate 120 can be adjusted to desired temperatures.

Figure 12:
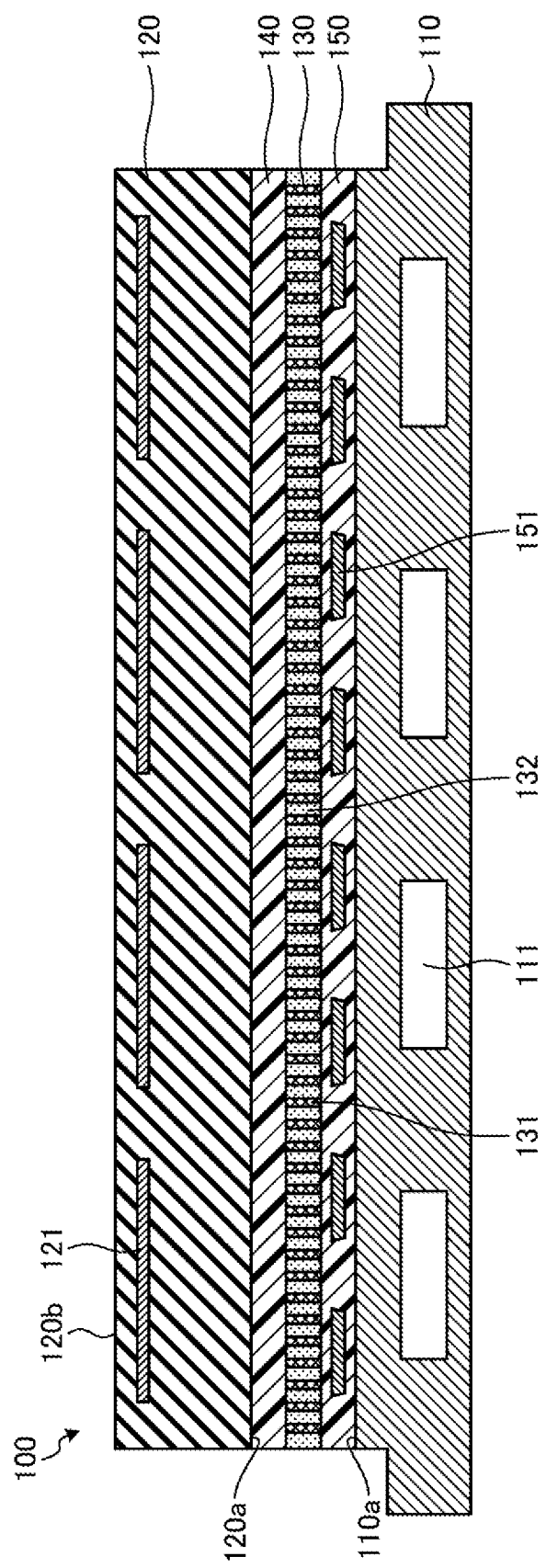
FIG. 12 shows a second modified embodiment of the substrate fixing device according to the second embodiment.

FIG. 12 shows a second modified embodiment of the substrate fixing device 100 according to the second embodiment. In FIG. 12, the same parts as those in FIG. 7 are denoted with the same reference signs.

In the modified embodiment shown in FIG. 12, a heater electrode 151 is arranged in the second adhesive 150. The heater electrode 151 generates heat when a voltage is applied thereto. Due to the heat generated by the heater electrode 141, the second adhesive 150 heats the ceramic plate 120 and the target object such as a wafer adsorbed on the upper surface 120*b* of the ceramic plate 120. In this way, the temperature of the ceramic plate 120 and the temperature of the target object such as a wafer adsorbed on the ceramic plate 120 can be adjusted to desired temperatures.

Note that the heater electrode may be individually arranged in the ceramic plate 120, the first adhesive 140, and the second adhesive 150, or may be arranged in at least one of the ceramic plate 120, the first adhesive 140, or the second adhesive 150.

Third Embodiment

A third embodiment is different from the first embodiment, in terms of a structure for protecting an outer surface of an adhesive layer against plasma.

Figure 13:
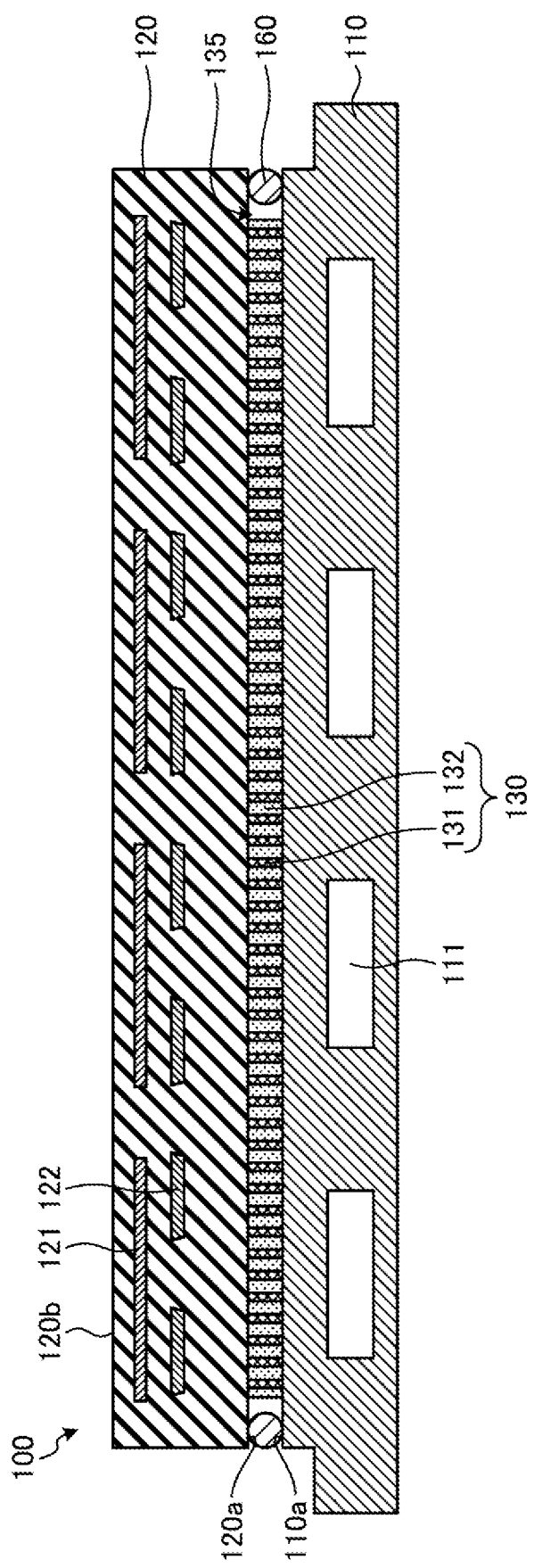
FIG. 13 is a schematic view showing a cross section of a substrate fixing device according to a third embodiment.

FIG. 13 is a schematic view showing a cross section of the substrate fixing device 100 according to the third embodiment. In FIG. 13, the same parts as those in FIG. 2 are denoted with the same reference signs. In the substrate fixing device 100 shown in FIG. 13, an outer surface of the adhesive layer 130 is located on a more inner side than an outer surface of the ceramic plate 120. The outer surface of the adhesive layer 130 forms a concave portion 135 at an outer circumference of the substrate fixing device 100, together with the lower surface 120*a* of the ceramic plate and the upper surface 110*a* of the base plate 110 facing each other. A seal member 160 for closing the concave portion 135 is arranged in the concave portion 135. In this way, the outer surface of the adhesive layer 130 can be protected against plasma.

That is, if the seal member 160 is not arranged, when the substrate fixing device 100 is used for plasma etching of a wafer, for example, the outer surface of the adhesive layer 130 may be exposed to plasma and consumed. In contrast, the seal member 160 is arranged in the concave portion 135 formed by the outer surface of the adhesive layer 130, and the lower surface 120*a* of the ceramic plate and the upper surface 110*a* of the base plate 110 facing each other, thereby inhibiting plasma from reaching the outer surface of the adhesive layer 130. As a result, contact of the plasma with the adhesive layer 130 can be suppressed, and thus consumption of the adhesive layer 130 by the plasma can be suppressed.

Figure 14:
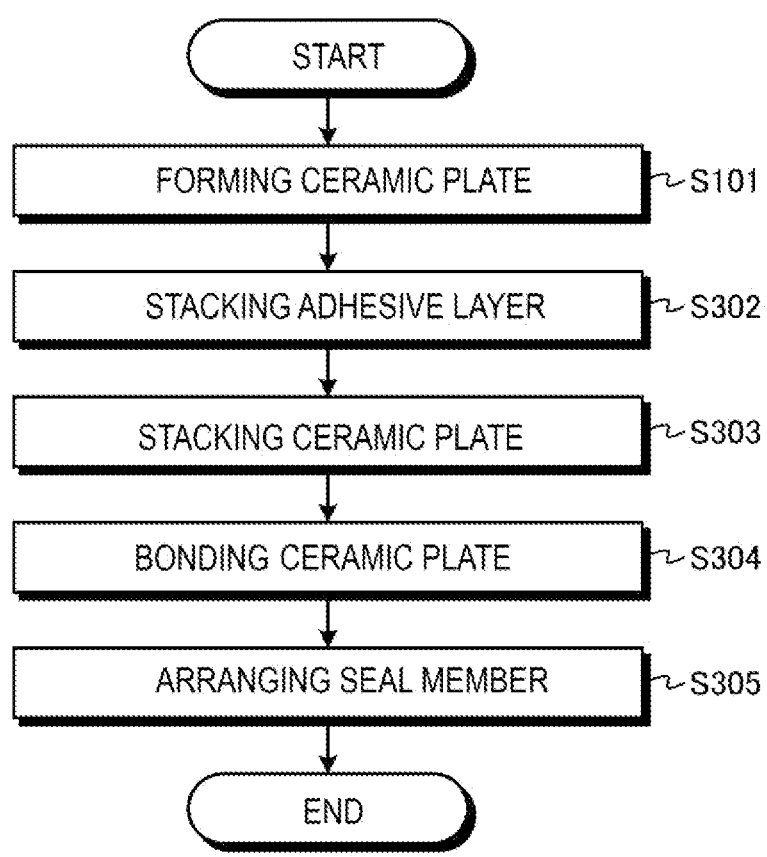
FIG. 14 is a flowchart showing a manufacturing method of the substrate fixing device according of the third embodiment.

Next, a manufacturing method of the substrate fixing device 100 configured as described above will be described with reference to FIG. 14. FIG. 14 is a flowchart showing a manufacturing method of the substrate fixing device 100 according to the third embodiment. Note that, in FIG. 14, the same parts as those in FIG. 3 are denoted with the same reference signs.

Figure 15:
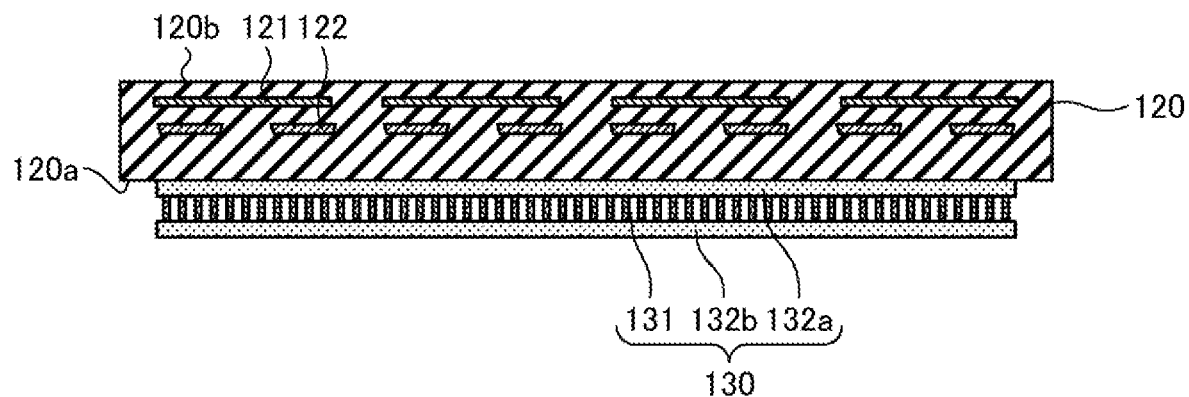
FIG. 15 shows a specific example of an adhesive layer stacking process.

When the ceramic plate 120 is formed in step S101, an adhesive layer is stacked on the ceramic plate 120 (step S302). Specifically, for example, as shown in FIG. 15, the adhesive layer 130 composed of the plurality of carbon nanotubes 131 and the resin sheets 132a and 132b is temporarily bonded to the lower surface 120a of the ceramic plate 120 from the resin sheet 132a side. FIG. 15 shows a specific example of an adhesive layer stacking process. The outer surface of the adhesive layer 130 is located on a more inner side than the outer surface of the ceramic plate 120. In the step in which the adhesive layer 130 is stacked on the ceramic plate 120, the resin 132 is not yet filled between the adjacent carbon nanotubes 131 in the adhesive layer 130.

Figure 16:
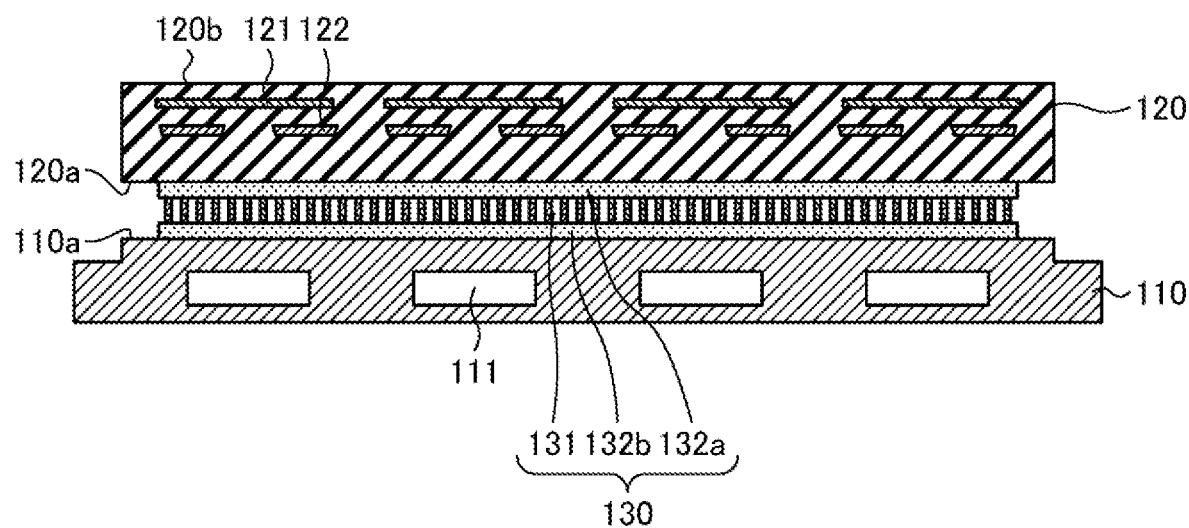
FIG. 16 shows a specific example of a ceramic plate stacking process.

Then, the ceramic plate 120 having the adhesive layer 130 stacked thereon is stacked on the base plate 110 via the adhesive layer 130 (step S303). Specifically, for example, as shown in FIG. 16, the ceramic plate 120 having the adhesive layer 130 stacked thereon is temporarily bonded to the upper surface 110a of the base plate 110 from the resin sheet 132b side of the adhesive layer 130. FIG. 16 shows a specific example of a ceramic plate stacking process.

Figure 17:
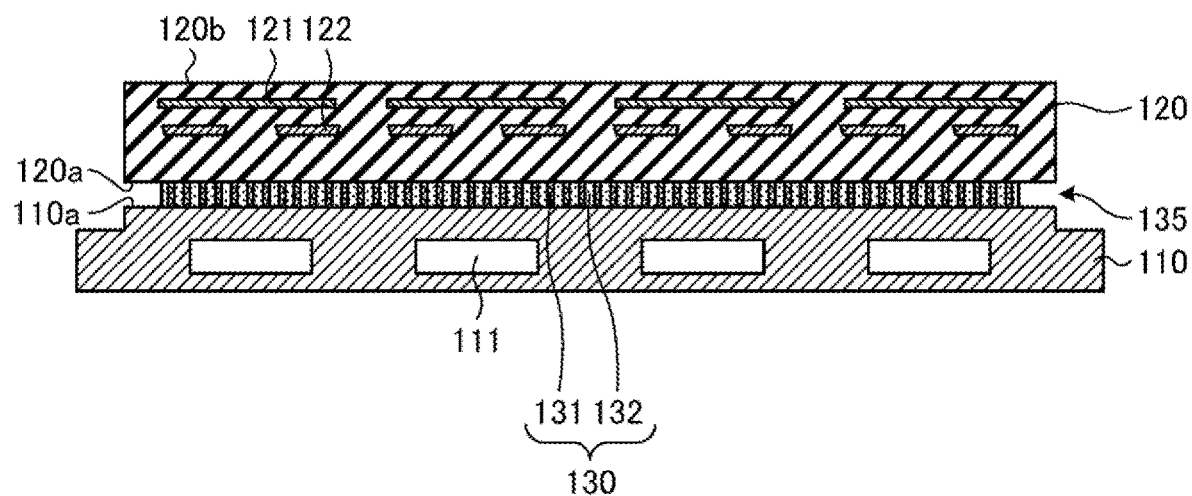
FIG. 17 shows a specific example of an intermediate structure.

Then, the ceramic plate 120 stacked on the base plate 110 via the adhesive layer 130 is bonded to the base plate 110 (step S304). Specifically, the semi-cured resin forming the resin sheets 132a and 132b is filled between the adjacent carbon nanotubes 131 in the adhesive layer 130 by heating and pressurization, and the filled resin is cured with being in contact with the first adhesive 140 and the second adhesive 150. Thereby, the resin 132 filled between the adjacent carbon nanotubes 131 and bonded to the ceramic plate 120 and the base plate 110 is formed. As a result, for example, as shown in FIG. 17, an intermediate structure of the substrate fixing device 100 in which the base plate 110 and the ceramic plate 120 are bonded by the adhesive layer 130 is obtained. FIG. 17 shows a specific example of an intermediate structure. In such an intermediate structure, the concave portion 135 is formed at the outer circumference of the intermediate structure by the outer surface of the adhesive layer 130, and the lower surface 120a of the ceramic plate 120 and the upper surface 110a of the base plate 110 facing each other.

When the intermediate structure is obtained, the seal member 160 for closing the concave portion 135 is arranged in the concave portion 135 at the outer circumference of the intermediate structure (step S305). Specifically, for example, the annular seal member 160 fits into the concave portion 135. As the annular seal member 160, for example, an O-ring, a potting resin or the like can be used. As the potting resin, for example, an epoxy-based resin, a silicone-based resin, a urethane-based resin or the like can be used. The seal member 160 is arranged in the concave portion 135, so that the substrate fixing device 100 is completed.

As described above, in the substrate fixing device according to the third embodiment, the outer surface of the adhesive layer is located on the more inner side than the outer surface of the ceramic plate. The outer surface of the adhesive layer forms a concave portion (e.g., concave portion 135) at the outer circumference of the substrate fixing device, together with the adhesive surface (e.g., lower surface 120a) of the ceramic plate and the adhesive surface (e.g., upper surface 110a) of the base plate facing each other. In the concave portion, a seal member (e.g., seal member 160) for closing the concave portion is arranged. Thereby, according to the substrate fixing device of the third embodiment, even when the substrate fixing device 100 is used for, for example, plasma etching of a wafer, consumption of the adhesive layer by plasma can be suppressed.

Fourth Embodiment

A fourth embodiment relates to a variation in structure of the adhesive layer 130 and the seal member 160 of the third embodiment.

Figure 18:
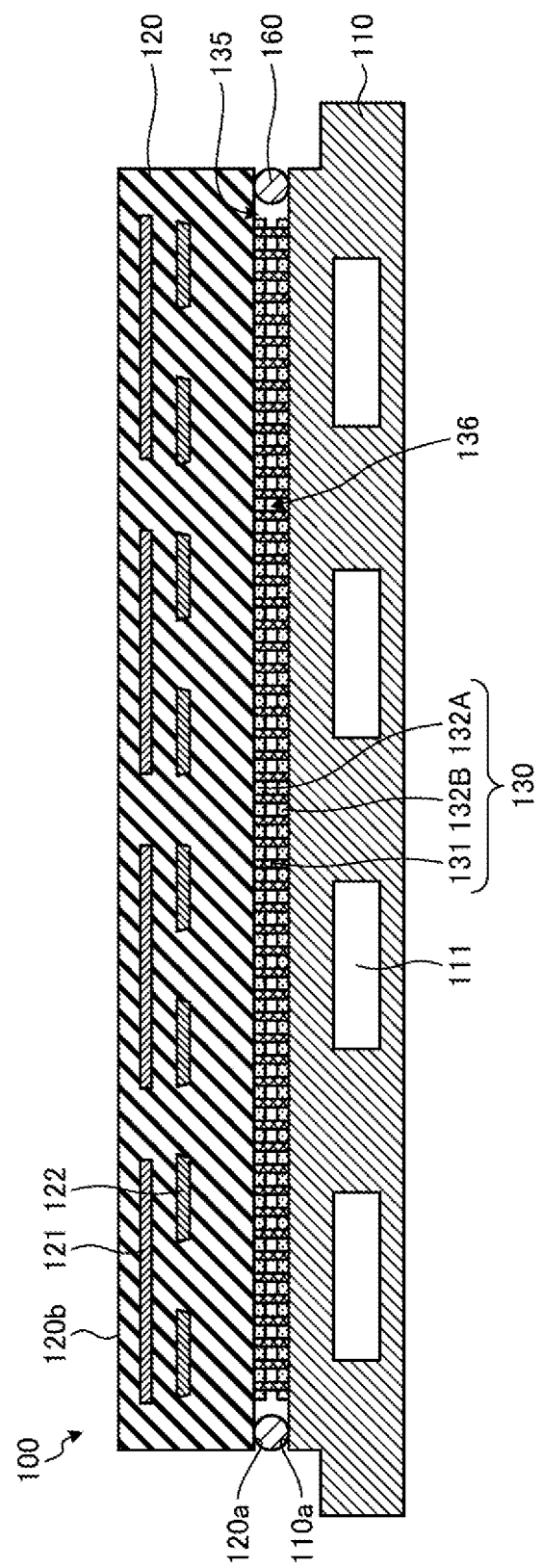
FIG. 18 is a schematic view showing a cross section of a substrate fixing device according to a fourth embodiment.

FIG. 18 is a schematic view showing a cross section of the substrate fixing device 100 according to the fourth embodiment. In FIG. 18, the same parts as those in FIG. 13 are denoted with the same reference signs. In the substrate fixing device 100 shown in FIG. 18, the adhesive layer 130 has, as the resin 132, a first resin 132A and a second resin 132B separated from each other. The first resin 132A covers the upper end portions of the carbon nanotubes 131 and is bonded to the ceramic plate 120. The second resin 132B covers the lower end portions of the carbon nanotubes 131 and is bonded to the base plate 110. The seal member 160 maintains a gap between the ceramic plate 120 and the base plate 110 so that a space 136 is formed between the first resin 132A and the second resin 132B. That is, the seal member 160 has a thickness that does not allow the first resin 132A and the second resin 132B to contact each other. In this way, even when the stress due to the difference in thermal expansion coefficient between the ceramic plate 120 and the base plate 110 acts on the adhesive layer 130, the stress is absorbed in the space 136 between the first resin 132A and the second resin 132B, and therefore, the damage to the adhesive layer 130 can be suppressed.

Figure 19:
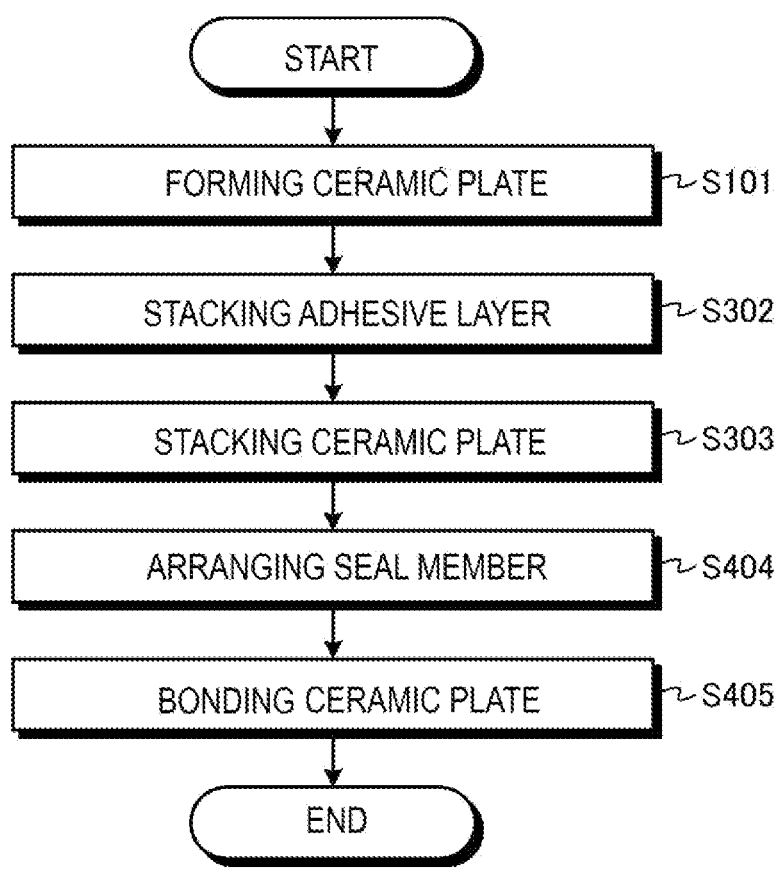
FIG. 19 is a flowchart showing a manufacturing method of the substrate fixing device according of the fourth embodiment.

Next, a manufacturing method of the substrate fixing device 100 configured as described above will be described with reference to FIG. 19. FIG. 19 is a flowchart showing a manufacturing method of the substrate fixing device 100 according of the fourth embodiment. Note that, in FIG. 19, the same parts as those in FIG. 14 are denoted with the same reference signs.

Figure 20:
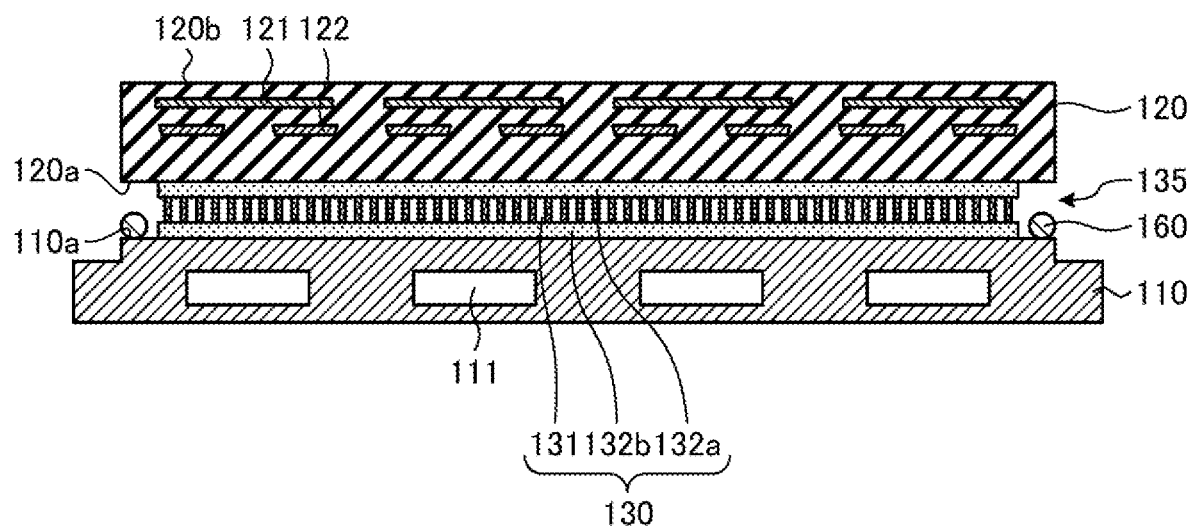
FIG. 20 shows a specific example of a seal member arranging process.

In step S303, the ceramic plate 120 is stacked on the base plate 110 via the adhesive layer 130, so that the outer surface of the adhesive layer 130 forms the concave portion 135 together with the lower surface 120a of the ceramic plate and the upper surface 110a of the base plate 110 facing each other. The seal member 160 for closing the concave portion 135 is arranged in the concave portion 135 (step S404). Specifically, for example, as shown in FIG. 20, the annular seal member 160 is placed on a bottom surface of the concave portion 135. FIG. 20 shows a specific example of a seal member arranging process. As the annular seal member 160, for example, an O-ring, a resin spacer or the like can be used.

When the seal member 160 is arranged, the ceramic plate 120 is bonded to the base plate 110 (step S405). Specifically, the semi-cured resin forming the resin sheet 132a is filled between the upper end portions of the adjacent carbon nanotubes 131 in the adhesive layer 130 by heating and pressurization, and the filled resin is cured with being in contact with the ceramic plate 120. Thereby, the first resin 132A filled between the upper end portions of the adjacent carbon nanotubes 131 and bonded to the ceramic plate 120 is formed. In addition, the semi-cured resin forming the resin sheet 132b is filled between the lower end portions of the adjacent carbon nanotubes 131 in the adhesive layer 130 by heating and pressurization, and the filled resin is cured with being in contact with the base plate 110. Thereby, the second resin 132B filled between the lower end portions of the adjacent carbon nanotubes 131 and bonded to the base plate 110 is formed. Upon the formation of the first resin 132A and the second resin 132B, a gap between the base plate 110 and the ceramic plate 120 is maintained by the seal member 160 so that a space is formed between the first resin 132A and the second resin 132B. When the gap between the base plate 110 and the ceramic plate 120 reaches a desired gap, the heating and pressurization are released, and thus the substrate fixing device 100 in which the base plate 110 and the ceramic plate 120 are bonded by the adhesive layer 130 is completed.

As described above, in the substrate fixing device according to the fourth embodiment, the adhesive layer includes the first adhesive (e.g., first resin 132A) and the second adhesive (e.g., second resin 132B). The first resin covers one end portions (e.g., upper end portions) of the heat transfer bodies (e.g., carbon nanotubes 131) and is bonded to the ceramic plate. The second resin covers the other end portions (e.g., lower end portions) of the heat transfer bodies and is bonded to the base plate. The seal member maintains the gap between the ceramic plate and the base plate so that a space is formed between the first resin and the second resin. Thereby, according to the substrate fixing device of the fourth embodiment, the damage to the adhesive layer can be suppressed.

This disclosure further encompasses various exemplary embodiments, for example, described below.

[1] A manufacturing method of a substrate fixing device, the manufacturing method comprising:
forming a ceramic plate having an electrode embedded therein for generating heat;
stacking, on the ceramic plate, an adhesive layer comprising a plurality of linear heat transfer bodies arranged adjacent to each other so that a longitudinal direction is along a stack direction of the ceramic plate and a base plate, and a resin sheet connected to end portions of the heat transfer bodies;
stacking the ceramic plate on the base plate via the adhesive layer; and
bonding the ceramic plate to the base plate by filling a resin for forming the resin sheet between adjacent heat transfer bodies of the heat transfer bodies in the adhesive layer by heating and pressurization to bond the resin to the ceramic plate and the base plate.

[2] The manufacturing method according to [1], wherein the stacking of the adhesive layer comprises stacking the adhesive layer on the ceramic plate via a first adhesive,
wherein the stacking of the ceramic plate comprises stacking the ceramic plate on the base plate via the first adhesive, the adhesive layer, and a second adhesive, and
wherein the bonding of the ceramic plate comprises bonding the resin filled between the adjacent heat transfer bodies in the adhesive layer to the ceramic plate via the first adhesive and to the base plate via the second adhesive.

[3] The manufacturing method according to [1], wherein the stacking of the adhesive layer further comprises:
stacking, on the ceramic plate, the adhesive layer whose outer surface is located on a more inner side than an outer surface of the ceramic plate, and
arranging a seal member for closing a concave portion in the concave portion formed by the outer surface of the adhesive layer after the bonding of the ceramic plate, and an adhesive surface of the ceramic plate and an adhesive surface of the base plate facing each other.

[4] The manufacturing method according to [1], wherein the stacking of the adhesive layer further comprises:
stacking an adhesive layer on the ceramic plate, the adhesive layer comprising a first resin sheet connected to one end portions of the heat transfer bodies and a second resin sheet connected to the other end portions of the heat transfer bodies and having an outer surface located on a more inner side than an outer surface of the ceramic plate,
arranging a seal member for closing a concave portion in the concave portion formed by the outer surface of the adhesive layer after the stacking of the ceramic plate, and an adhesive surface of the ceramic plate and an adhesive surface of the base plate facing each other, and
wherein the bonding of the ceramic plate comprises:
filling a first resin forming the first resin sheet between one end portions of the adjacent heat transfer bodies in the adhesive layer, and filling a second resin forming the second resin sheet between the other end portions of the adjacent heat transfer bodies by heating and pressurization, and
maintaining a gap between the base plate and the ceramic plate by the seal member so that a space is formed between the first resin and the second resin.

What is claimed is:

1. A substrate fixing device comprising:
a base plate;
a ceramic plate fixed to the base plate, the ceramic plate configured to adsorb a substrate by electrostatic force; and
an adhesive layer bonding the base plate and the ceramic plate,
wherein the adhesive layer comprises:
a plurality of linear heat transfer bodies arranged adjacent to each other such that a longitudinal direction of each linear heat transfer body is along a stack direction of the ceramic plate and the base plate, and
a resin filled between adjacent heat transfer bodies of the heat transfer bodies and bonded to the ceramic plate and the base plate,
wherein each of the heat transfer bodies is a carbon nanotube, and
wherein the resin covers the carbon nanotubes in a state in which both end surfaces of each of the carbon nanotubes in the longitudinal direction are exposed.

2. The substrate fixing device according to claim 1, further comprising:
a first adhesive arranged between the ceramic plate and the adhesive layer; and
a second adhesive arranged between the base plate and the adhesive layer,
wherein the adhesive layer is bonded to the ceramic plate via the first adhesive and is bonded to the base plate via the second adhesive.

3. The substrate fixing device according to claim 2, wherein at least one of the ceramic plate, the first adhesive, or the second adhesive has an electrode embedded therein for generating heat.

4. The substrate fixing device according to claim 1, wherein an outer surface of the adhesive layer is located on a more inner side than an outer surface of the ceramic plate and is configured to form a concave portion at an outer circumference of the substrate fixing device, together with an adhesive surface of the ceramic plate and an adhesive surface of the base plate facing each other, and
wherein the substrate fixing device comprise a seal member arranged in the concave portion and closing the concave portion.

5. The substrate fixing device according to claim 4, wherein the resin includes a first resin and a second resin separated from each other, wherein the first resin is configured to cover one end portions of the heat transfer bodies and is bonded to the ceramic plate, wherein the second resin is configured to cover the other end portions of the heat transfer bodies and is bonded to the base plate, and wherein the seal member is configured to maintain a gap between the ceramic plate and the base plate so that a space is formed between the first resin and the second resin.

* * * * *